United States Patent [19]

Hornak

[11] 4,107,670
[45] Aug. 15, 1978

[54] CHARGE COUPLED DIGITAL TO ANALOG CONVERTER

[75] Inventor: Thomas Hornak, Los Altos, Calif.

[73] Assignee: Hewlett-Packard Company, Palo Alto, Calif.

[21] Appl. No.: 677,955

[22] Filed: Apr. 19, 1976

[51] Int. Cl.² ............................................. H03K 13/02
[52] U.S. Cl. ..................... 340/347 DA; 340/347 M
[58] Field of Search ......... 357/24; 307/221 R, 221 C, 307/221 D; 340/347 DA, 347 AD, 347 M

[56] References Cited

U.S. PATENT DOCUMENTS 3,836,906   9/1974   Ando et al. .................... 340/347 DA
3,930,255   12/1975   Means ............................ 340/347 AD

OTHER PUBLICATIONS

Mok et al., A Charge–Transfer–Device Logic Cell, Solid State Electronics, 1974, vol. 17, pp. 1147–1154.

*Primary Examiner*—Thomas J. Sloyan
*Attorney, Agent, or Firm*—Theodore Scott Park

[57] ABSTRACT

A charge coupled digital to analog converter includes a charge divider coupled to a reference charge generator for producing a plurality of predetermined reference charge portions. The charge portions are applied to a plurality of charge gates, each having outputs and each being coupled to a conditional clock generator for selectively sinking or transferring the charge portion it receives in response to a digital signal to be converted. A charge summer is coupled to receive transferred charge portions from the plurality of charge gates for summing the charge portions received and applying the summed charge to a charge-to-voltage converter which produces an analog voltage corresponding to the applied digital signal.

7 Claims, 3 Drawing Figures

CHARGE COUPLED DIGITAL TO ANALOG CONVERTER

BACKGROUND AND SUMMARY OF THE INVENTION

Charge-coupled devices are known to be used as building blocks for digital and analog shift registers. In the prior art an input signal is converted to an amount of charge and the charge is transferred from a charge-coupled device cell to a next charge-coupled device cell, the cells usually being arranged in a row. The last cell in the row is coupled to a charge detector which converts the transferred charge into a suitable output signal. If only two values of charge are being transferred, the device is commonly referred to as a digital shift register and one value of charge is assigned to a logic level 1, the other to a logic level 0, and the cells are referred to as digital charge transfer cells. If all possible amounts of charge within the limitations of the shift register are transferred between cells, the device is referred to as an analog shift register and the cells are referred to as analog charge transfer cells.

The invention is a digital-to analog converter which combines charge-coupled devices in selected combinations for charge-summing and charge-splitting in response to an applied digital signal to implement a digital to analog conversion. The invention selectively divides a reference charge into a plurality of predetermined reference charge portions, selectively sinks or transfers the predetermined reference charge portions to a charge summer in response to an applied digital signal, sums the charge portions and converts the summed charge to produce an analog signal corresponding to the applied digital signal.

DESCRIPTION OF THE PREFERRED EMBODIMENT

Figure 1:
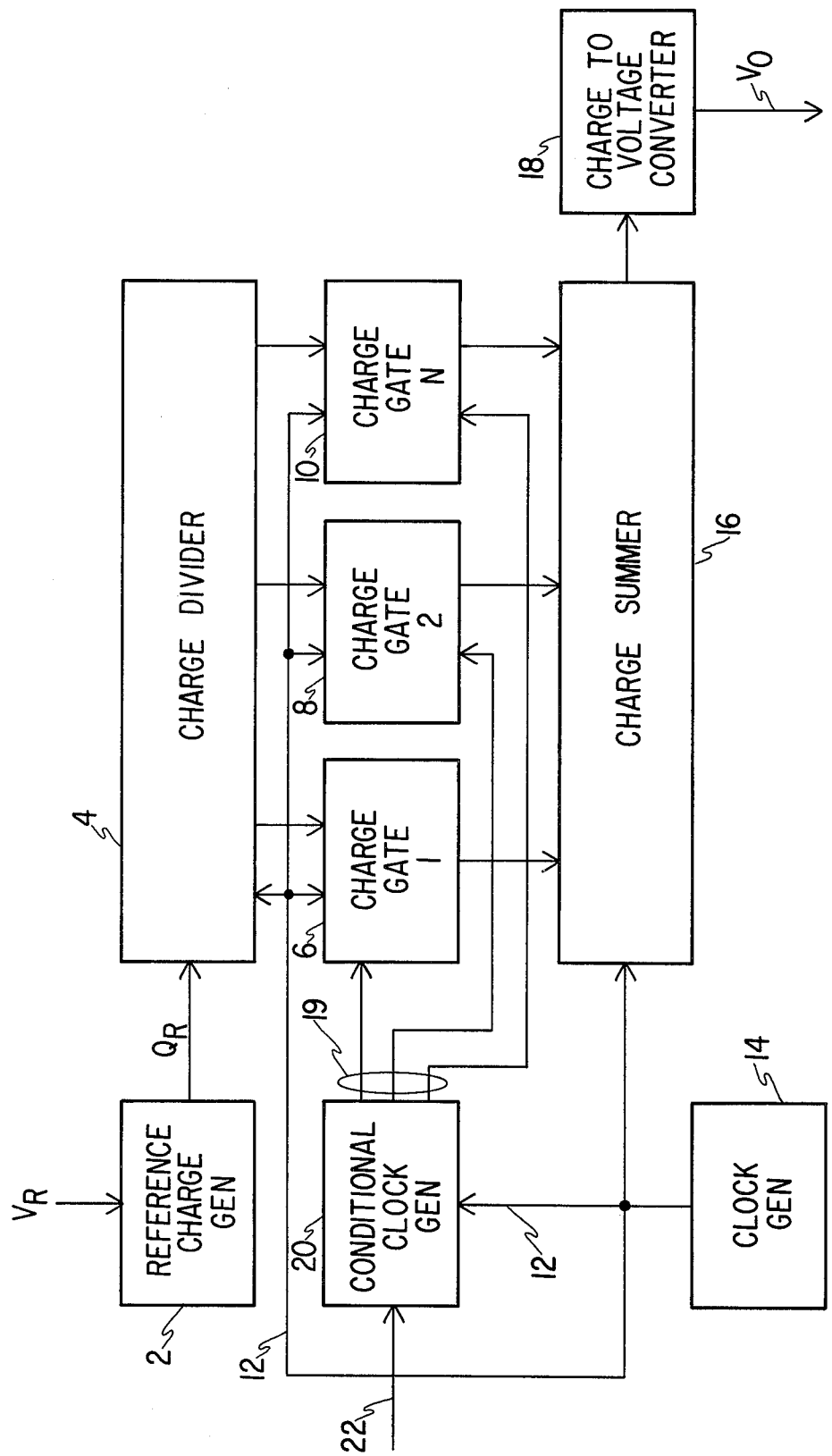
FIG. 1 is a block diagram of a digital-to-analog converter constructed in accordance with the invention.

Referring to FIG. 1, a reference charge generator 2 applies a reference charge $Q_R$ to a charge divider 4. Charge divider 4 splits the reference charge $Q_R$ into predetermined reference charge portions and applies these charge portions to a plurality of charge gates 6, 8 and 10 in response to a clock signal 12, produced by clock generator 14. Charge gates 6, 8 and 10 selectively sink or transfer to a charge summer 16 the reference charge portions in response to a clock signal 12, produced by clock generator 14. Charge gates 6, 8 and 10 selectively sink or transfer to a charge summer 16 the reference charge portions in response to a conditional clock signal 19 received from a conditional clock generator 20. The conditional clock generator 20 produces the conditional clock signal 19 in response to an applied digital signal 22 and the clock signal 12. The charge summer 16 sums the charge portions received by it from the charge gates 6, 8 and 10 and applies the summed charge to a charge to voltage converter 18. The charge to voltage converter 18 produces an output voltage $V_o$ representing an analog conversion of the applied digital signal 22.

Figure 2:
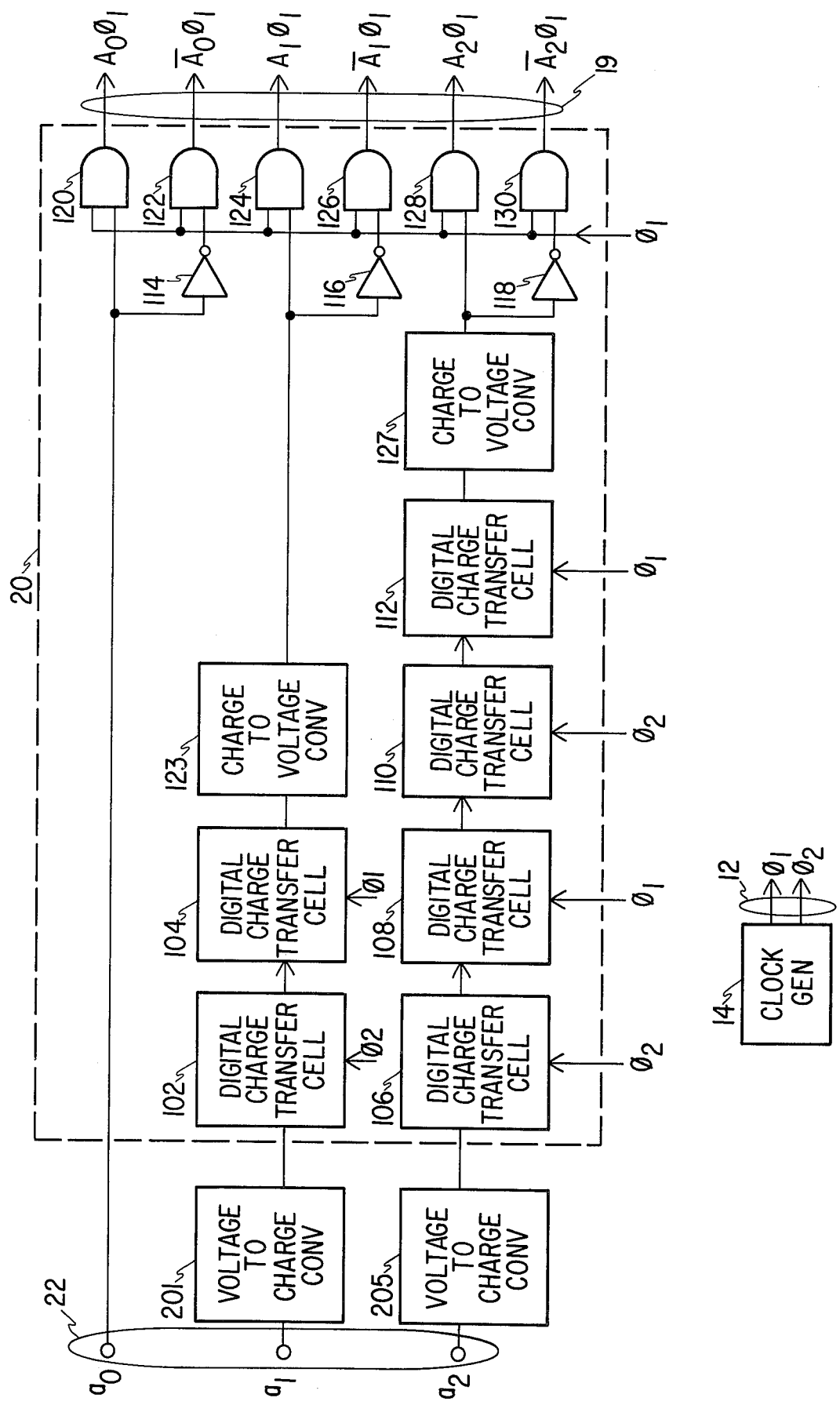
FIG. 2 shows a conditional clock generator for use with the converter of FIG 1.

Referring to FIG. 2 and assuming two phase charge coupled devices having built-in directionality of charge transfer, as described, for example, on page 71 of a paper by E. Carnes and W. F. Kosonocky, entitled "Charge Coupled Devices" and appearing at pages 67–77 of the April issue of Solid State Technology, clock generator 14 produces a two-phase clock signal 12 having phases $\phi_1$ and $\phi_2$. The applied digital signal 22 is shown as being a parallel three-bit word having bits $a_0$, $a_1$ and $a_2$. The parallel input bits $a_1$ and $a_2$ are converted to charge, delayed, converted to voltage, and bits $a_0$, $a_1$ and $a_2$ processed to generate conditional clock signals. Bit $a_0$ is applied to an inverter 114 and AND-gate 120. Bit $a_1$ is coupled by a voltage to charge generator 201 to a digital charge transfer cell 102 having an output coupled to a digital charge transfer cell 104. Digital transfer cell 102 accepts the charge applied to it in response to receiving clock phase $\phi_2$, and digital charge transfer cell 104 accepts and transfers the charge it receives in response to receiving clock phase $\phi_1$. The output of digital charge transfer cell 104 is coupled by a charge to voltage converter 123 to an input of AND-gate 124 and to an inverter 116. The output of inverter 116 is coupled to an input of AND-gate 126. Bit $a_2$ is coupled by a voltage to charge converter 205 to a digital charge transfer cell 106. Digital charge transfer cell 106 accepts charge in response to receiving clock phase $\phi_2$. The output of digital charge transfer cell 106 is coupled to an input of a digital charge transfer cell 108. The digital charge transfer cell 108 accepts the charge in response to phase $\phi_1$. The output of digital charge transfer cell 108 is coupled to an input of a digital transfer cell 110. The digital charge transfer cell 110 accepts charge in response to clock phase $\phi_2$. The output of the digital charge transfer cell 110 is coupled to an input of a digital charge transfer cell 112. The digital charge transfer cell 112 transfers the charge received in response to receiving clock phase $\phi_1$. The output of the digital charge transfer cell 112 is coupled by a charge to voltage converter 127 to an input of an AND-gate 128 and to the input of an inverter 118. The output of inverter 118 is coupled to an input of AND-gate 130.

The AND-gates 120, 122, 124, 126, 128 and 130 each have an input coupled to receive clock phase $\phi_1$ from clock generator 14. AND-gate 120 produces conditional clock signal $A_0\phi_1$ as an output, AND-gate 122 produces conditional clock signal $\bar{A}_0\phi_1$, AND-gate 124 produces conditional clock signal $A_1\phi_1$, AND-gate 126 produces conditional clock signal $\bar{A}_1\phi_1$, AND-gate 128 produces conditional clock signal $A_2\phi_1$, and AND-gate 130 produces conditional clock signal $\bar{A}_2\phi_1$.

Figure 3:
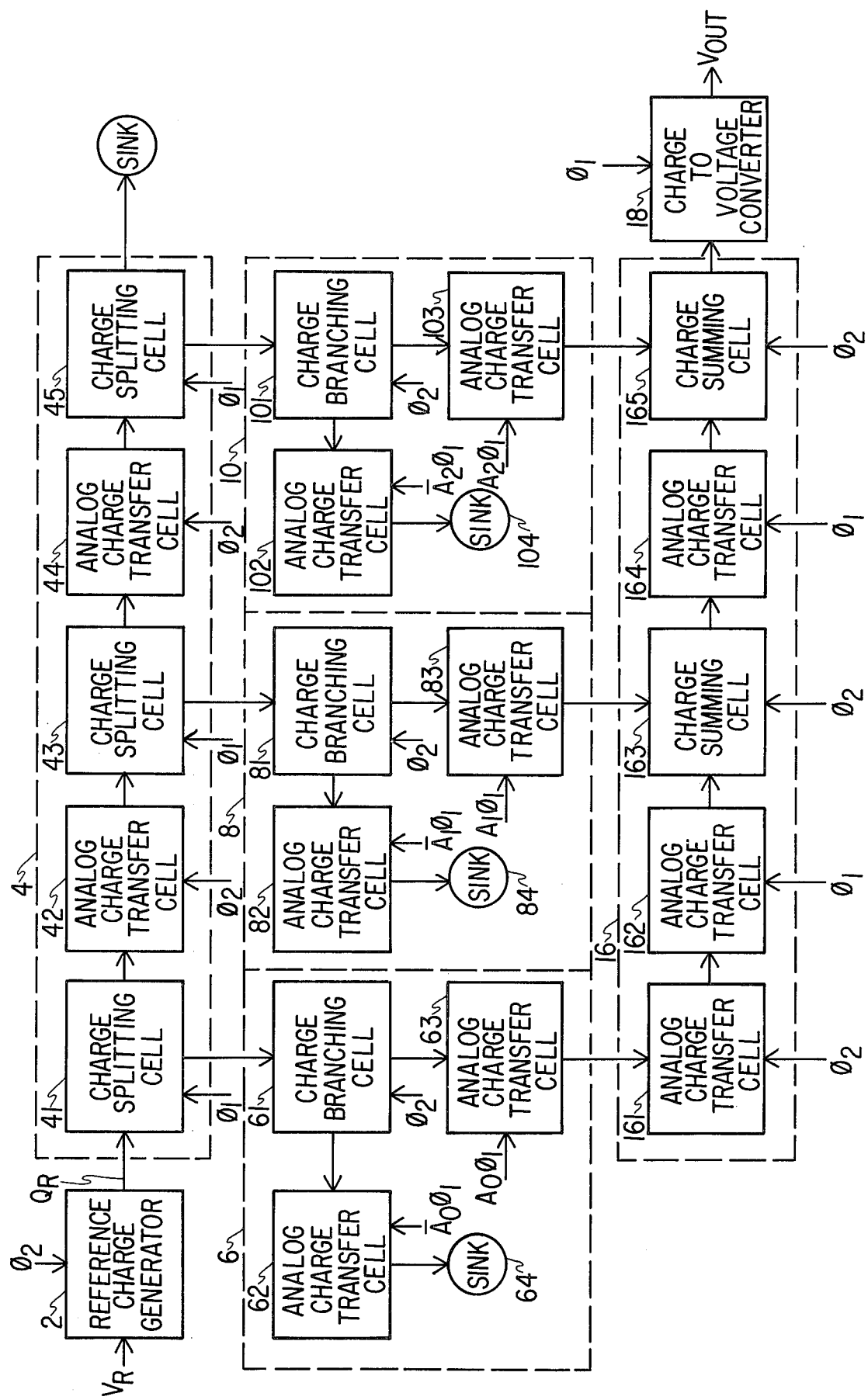
FIG. 3 is a block diagram illustrating a charge divider, charge gates, and a charge summer, made in accordance with the invention.

Referring to FIG. 3 and assuming two phase charge coupled devices having directionality of charge transfer, the reference charge generator 2 produces a reference charge $Q_R$ in response to receiving the clock phase $\phi_2$ from the clock generator 14, and transfers the reference charge $Q_R$ to charge splitting cell 41 within the charge divider 4 in response to cell 41 receiving clock phase $\phi_1$. The charge splitting cell 41 divides $Q_R$ into two parts, each equal to $Q_R/2$. Charge splitting cell 41 is coupled to an analog charge transfer cell 42 and a charge branching cell 61. Charge splitting cells, charge branching cells and charge summing cells are fully described in applicant's copending U.S. patent application entitled "CHARGE SPLITTING DEVICE" and said application is hereby fully incorporated by reference. A first portion, of charge $Q_R/2$ is clocked into analog charge transfer cell 42 in response to cell 42 receiving clock phase $\phi_2$ and a second portion, of charge $Q_R/2$ is clocked into the charge branching cell 61 in response to cell 61 receiving clock phase $\phi_2$. Analog charge transfer cell 42 is coupled to a charge splitting cell 43 and transfers a charge portion $Q_R/2$ to a charge splitting cell 43 in response to cell 43 receiving the clock phase $\phi_1$. The charge splitting cell 43 is coupled to an analog charge transfer cell 44 and a charge branching cell 81, and transfers charge portions $Q_R/4$ thereto in response to cells 44 and 81 receiving the clock phase $\phi_2$. The analog charge transfer cell 44 transfers charge portion $Q_R/4$ to a charge splitting cell 45 in response to cell 45 receiving clock phase $\phi_1$. The charge splitting cell 45 is coupled to a charge sink and to a charge branching cell 101. The charge splitting cell 45 splits the charge it receives into two equal portions, $Q_R/8$, and transfers the portions to the sink and to a charge branching cell 101 in response to cell 101 receiving the clock phase $\phi_2$.

Referring to FIG. 3 and charge gate 6, the charge branching cell 61 receives charge-portion $Q_R/2$ from the charge splitting cell 41 within charge divider 4 and transfers charge $Q_R/2$ either via an analog charge transfer cell 62 to sink 64 or to an analog charge transfer cell 63. The analog charge transfer cell 62 is coupled to receive the conditional clock signal $\overline{A}_0\phi_1$ and accepts charge from cell 61 in response to receiving conditional clock signal $\overline{A}_0\phi_1$. The analog charge transfer cell 63 is coupled to receive the conditional clock signal $A_0\phi_1$ and accepts charge from cell 61 in response to receiving clock signal $A_o\phi_1$.

Referring to FIG. 3 and charge summer 16, the analog charge transfer cell 161 is coupled to an analog charge transfer cell 162 and passes the charge it receives from cell 63 to the analog charge transfer cell 162, in response to cell 162 receiving the clock phase $\phi_1$. The analog charge transfer cell 162 is coupled to a charge summing cell 163 and passes the charge it receives thereto in response to cell 163 receiving the clock phase $\phi_2$.

Charge gate 8 is coupled to receive charge portion $Q_R/4$ from the charge splitting cell 43. A charge branching cell 81 is coupled to receive the charge portion $Q_R/4$ in response to receiving the clock phase $\phi_2$ and passes the charge either via an analog charge-transfer cell 82 to sink 84 or to an analog charge transfer cell 83. The analog charge transfer cell 82 is coupled to receive the conditional clock signal $\overline{A}_1\phi_1$ and accepts charge in response to receiving $\overline{A}_1\phi_1$. The analog charge-transfer cell 83 is coupled to receive conditional clock signal $A_1\phi_1$ and accepts charge from cell 81 in response to receiving signal $A_1\phi_1$. Cell 83 is coupled to the charge summing cell 163 within charge summer 16 and transfers the charge to cell 163 in response to cell 163 receiving the clock phase $\phi_2$.

The charge gate 10 is coupled to receive the charge portion $Q_R/8$ from the charge splitting cell 45 within the charge divider 4. A charge branching cell 101 is coupled to the charge splitting cell 45 and to an analog transfer cell 102 and an analog charge transfer cell 103. The charge branching cell 101 passes the charge it receives either via the analog charge transfer cell 102 to sink 104 or to the analog charge transfer cell 103 in response to cell 102 receiving the conditional clock signal $\overline{A}_2\phi_1$ or cell 103 receiving the conditional clock signal $A_2\phi_1$. The analog charge transfer cell 103 passes the charge it receives to the charge summing cell 165 within charge summer 16 in response to cell 165 receiving clock phase $\phi_2$.

A charge to voltage converter 18 is coupled to the charge summing cell 165 within the charge summer 16 for producing an output voltage which is given by $$V_{out} = a_0(V_R/2) + a_1(V_R/4) + a_2(V_R/8)$$

where $a_0$, $a_1$ and $a_2$ are the values (0 or 1) of the bits of the digital word applied to the conditional clock generator 20, $V_R$ is the reference voltage applied to the reference charge generator 2 corresponding to the reference charge $Q_R$ and the product of the charge to voltage characteristic of converter 18 and the voltage to charge characteristic of generator 2 is substantially equal to one.

Although the peferred embodiment has been described for parallel three-bit input words, the extension to more bits or a modification for serial input is clear to one skilled in the art. Further, although the preferred embodiment described herein for the charge divider 4 successively splits charge applied thereto, it is to be understood that any preselected charge ratio may be used and the invention is not to be limited thereto.

I claim:

1. A digital to analog converter comprising:
   means for producing a reference charge;
   charge dividing means coupled to receive the reference charge for producing a plurality of binary weighted charge portions;
   charge gating means coupled to receive the plurality of binary weighted charge portions and an applied digital signal having a plurality of bits for gating each of the plurality of binarily weighted charge portions in response to one value of the corresponding bit of the applied digital signal to thereby select it and for gating each of the plurality of binarily weighted charge portions in response to the other value of the corresponding bit of the applied digital signal to thereby sink it; and
   charge summing means coupled to receive the selected binarily weighted charge portions and sum them to thereby generate a corresponding output analog quantity.

2. A digital to analog converter as in claim 1 wherein the charge dividing means produces successively halved portions of the applied reference charge as the plurality of predetermined charge portions.

3. A digital to analog converter as in claim 1 wherein charge gating means comprise:
   conditional clock generating means for producing a plurality of complementary conditional clock signals, the complementary conditional clock signals being produced in response to receiving a selected logic level of a corresponding bit of the applied digital signal to be converted and a clock signal; and
   a plurality of charge gates, each gate being coupled to receive a first complementary conditional clock signal and a second complementary conditional clock signal of said plurality of complementary conditional clock signals and a predetermined charge portion for selectively producing the predetermined charge portion at an output in response to receiving the first complementary conditional clock signal and for sinking the predetermined charge portion in response to receiving the second complementary conditional clock signal.

4. A digital to analog converter as in claim 1 comprising a charge to voltage converter coupled to the charge summing means for producing a voltage corresponding to summed binarily weighted predetermined charge portions.

5. A digital to analog converter as in claim 2 wherein charge dividing means comprise:
- a first charge splitting cell having first and second outputs and coupled to receive the reference charge for producing substantially half the reference charge at each output;
- a second charge splitting cell coupled to the first charge splitting cell output for producing as an output a charge portion substantially equal to one-fourth of the reference charge.

6. A digital to analog converter as in claim 3 wherein a charge gate comprises:
- a charge sink;
- a charge branching cell having an input and a first and second output;
- a first analog charge transfer cell coupled to receive the second complementary conditional clock signal and having an input coupled to the first output of the charge branching cell and an output coupled to the charge sink; and
- a second analog charge transfer cell coupled to receive the first complementary conditional clock signal and having an input coupled to the second output of the charge branching cell and having an output.

7. A digital to analog converter as in claim 3 wherein charge summing means comprise:
- a first analog charge transfer cell having an input coupled to the output of a first of the plurality of charge gates and having an output; and
- a charge summing cell having a first input coupled to a first analog charge transfer cell output and a second input coupled to the output of a second of the plurality of charge gates.

* * * * *